United States Patent
Chang (10) Patent No.: US 7,115,455 B2
(45) Date of Patent: Oct. 3, 2006

(54) METHOD OF FABRICATING POLYSILICON FILM

(75) Inventor: Mao-Yi Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 105 days.

(21) Appl. No.: 10/709,038

(22) Filed: Apr. 8, 2004

(65) Prior Publication Data

US 2005/0019995 A1    Jan. 27, 2005

(30) Foreign Application Priority Data

Jul. 24, 2003    (TW) ............................... 92120193 A (51) Int. Cl.
*H01L 21/84* (2006.01)
(52) U.S. Cl. .................... 438/166; 438/479
(58) Field of Classification Search ........ 438/151–166, 438/479
See application file for complete search history.

(56) References Cited

U.S. PATENT DOCUMENTS 6,815,269 B1 * 11/2004 Okumura .................... 438/149
2005/0019994 A1 * 1/2005 Chang ........................ 438/166

* cited by examiner

*Primary Examiner*—Richard A. Booth
(74) *Attorney, Agent, or Firm*—Jianq Chyun IP Office (57) ABSTRACT

A method of fabricating polycrystalline silicon layer of TFT is provided. The method includes sequentially forming an insulating layer, a first amorphous silicon layer, and a cap layer on a substrate. A laser annealing is performed to transform the first amorphous silicon layer to a first polycrystalline silicon layer, wherein at least one hole is formed in the amorphous silicon layer during the laser annealing process. Thereafter, the cap layer is removed. A portion of the insulating layer exposed within the hole is removed to form a second opening. A second amorphous silicon layer is formed over the first polycrystalline silicon layer filling the second opening. Finally a second annealing is performed to transform the second amorphous silicon layer to a second polycrystalline silicon layer.

6 Claims, 10 Drawing Sheets

METHOD OF FABRICATING POLYSILICON FILM

CROSS REFERENCE TO RELATED APPLICATIONS

This application claims the priority benefit of Taiwan application Ser. No. 92120193, filed Jul. 24, 2003.

BACKGROUND OF INVENTION

1. Field of the Invention

This invention relates to a method of fabricating Thin Film Transistor Liquid Crystal Display (TFT-LCD), and more particularly, relates to a method of fabricating a polysilicon film of TFT array in a TFT-LCD thereof.

2. Description of the Related Art

An ordinary active TFT LCD array is generally categorized into polysilicon TFT and amorphous silicon TFT based materials used for making the TFT LCD, where a polysilicon (poly-Si) TFT being capable of integrating driving circuit thus provides a higher opening rate and lower fabrication cost than a corresponding amorphous silicon (a-Si) TFT. Another reason that polysilicon TFT technology is greatly promoted is that poly-Si TFT significantly reduces device feature size so that high image resolution can be achieved. In order to mass-produce polysilicon TFT-LCD, three primary conditions are low temperature (about 450 to 550° C.) process, low-temperature filming technology for high quality gate-insulator layer, and broad ion-implantation.

In view of the cost of a glass substrate, low temperature thin film process is adopted where Solid Phase Crystallization (SPC) is introduced thereby, yet the active temperature not only tends to be relatively higher than expected, which is around 600° C., but also causes degraded crystallization. Thus Excimer Laser Crystallization (ELC) or Excimer Laser Annealing (ELA) process that is applied to the foregoing low-temperature TFT process is developed, wherein an a-Si thin film is fused by laser scanning and is crystallized to poly-Si thin film.

Providing process temperature lower than 450° C. in ELC and providing higher electron mobility and lower current leakage than SPC in forming an amorphous silicon thin film, a less expensive glass substrate is introduced so as to reduce fabrication cost whereas better TFT device characteristic is obtained thereby.

Figure 1A:
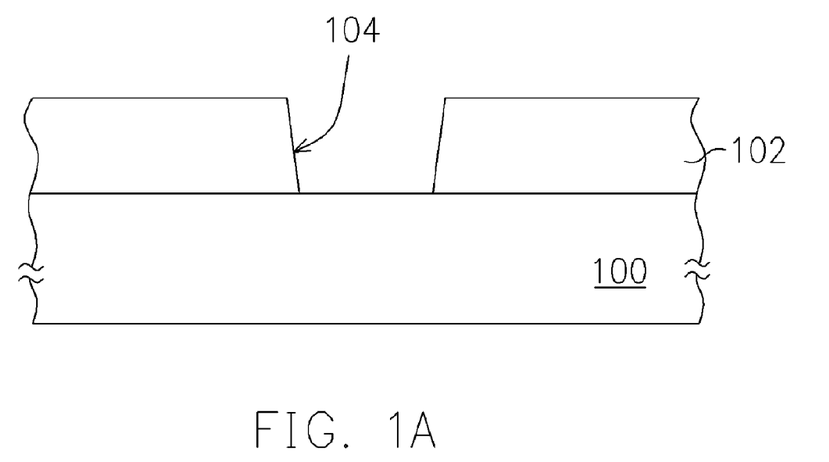
FIGS. 1A to 1D show the cross sectional views illustrating the progression of the process according to a conventional method of fabricating a polysilicon (poly-Si) thin film.

Referring to FIG. 1A, a substrate 100 is provided. A first insulating layer 102 is formed on the substrate 100. Next, a photolithography etching is performed to form a first opening 104 in the first insulating layer 102. In the submicron technology, the photolithography technology is not applicable to the present micro TFT field, because the threshold feature of the first opening 104 using photolithography technique is about 1 micrometer, which is relatively large compared to the threshold crystal feature size for TFT thin film.

Figure 1B:
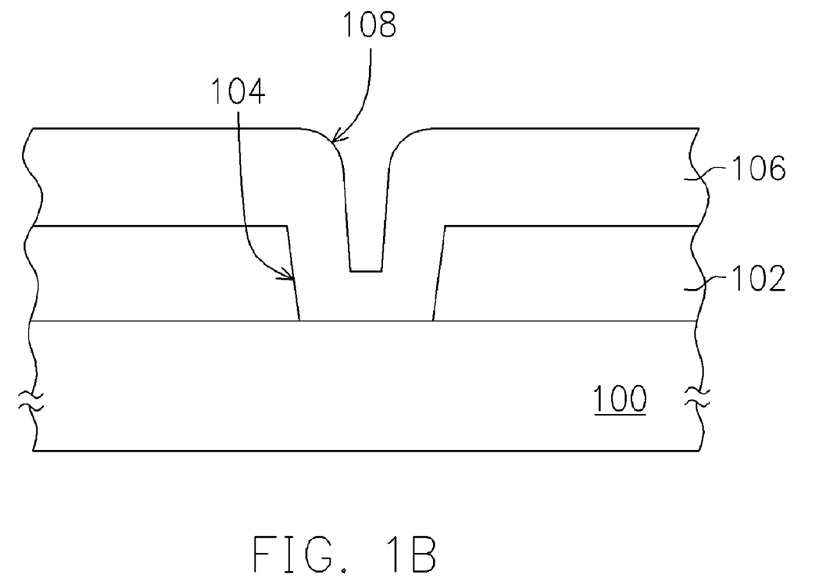

Attempts to resolve the issue is illustrated with reference to FIG. 1B. A second insulating layer 106 is further formed over the first insulating layer 102 and the first opening 104. The deposition of the second insulating layer 106 further shrinks the first opening 104 to a second opening 108 to satisfy the feature size requirement for polysilicon TFT crystallization.

Figure 1C:
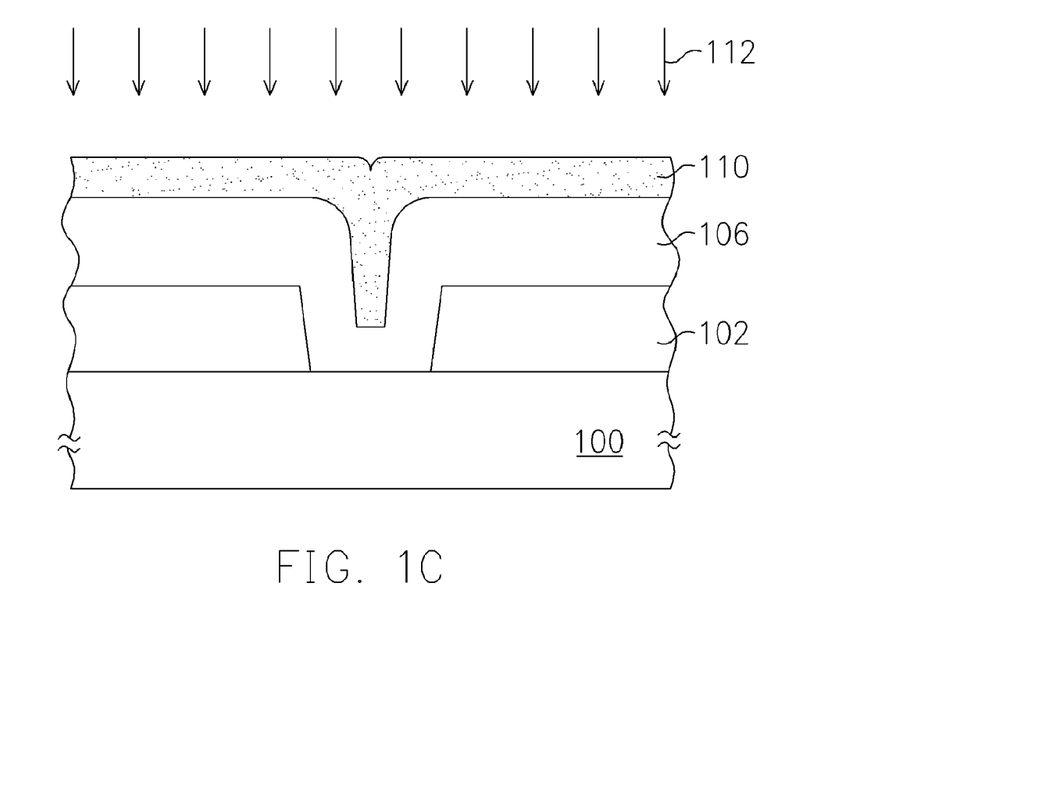

Referring to FIG. 1C, an a-Si layer 110 is formed over the second insulating layer 106. Next, fuse and liquefy the a-Si layer 110 by an Excimer Laser 112.

Figure 1D:
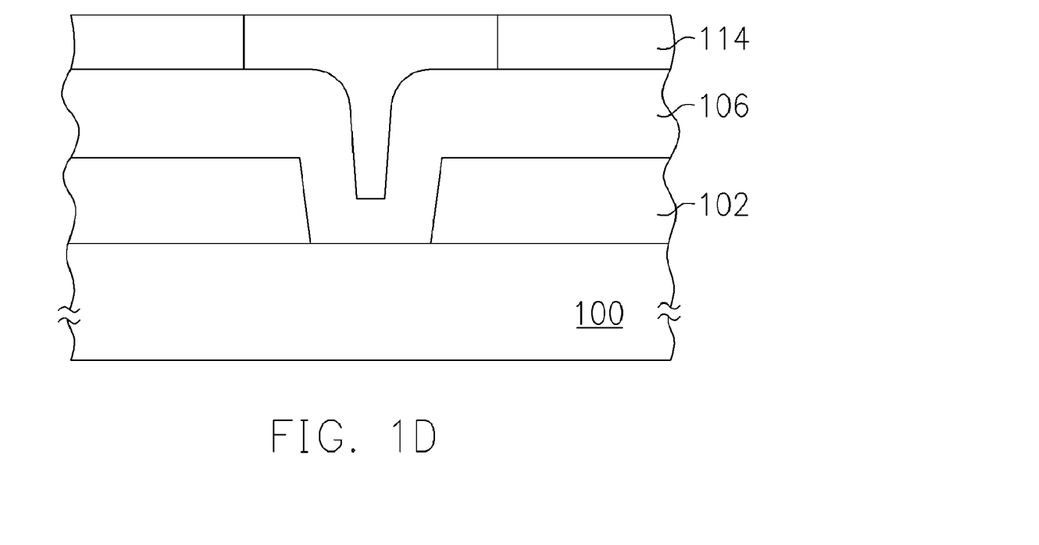

Finally, referring to FIG. 1D, the fused liquefied silicon undergoes crystallization from the second opening 108 to transform the a-Si layer 110 into a poly-Si layer 114, which is suitable for forming source/drain and channel of a TFT therein.

However, problems in the foregoing process do exist, as described below.

The forming of the first opening 104 in the foregoing process requires a mask process and an additional deposition step of forming the second insulating layer 106 adjusting to the size of the first opening 104, and therefore not only complication but also lowers throughput results.

Moreover, the scheme of depositing the second insulating layer 106 for adjusting to the size of the second opening 108 requires precise control of the process conditions, thus narrowing the processing tolerance window.

SUMMARY OF INVENTION

According to foregoing issues, one object of the present invention is to provide a method of fabricating a poly-Si thin film, wherein the steps of complicated photolithography exposure, extra deposition procedure, etc. can be excluded, and an opening with proper deep sub-micron dimensions can be formed.

Another object of the present invention is to provide a method of fabricating a poly-Si film, wherein an opening having a size sufficient for poly-Si thin film crystallization can be formed without precise control of process conditions, and thereby increasing the process window allowing greater process condition tolerance.

The present invention provides a method of fabricating a poly-Si layer, wherein a substrate is provided, an insulating layer, a first a-Si layer, and a cap layer are sequentially formed over the substrate. A first laser annealing is performed for transforming the first a-Si layer into a first poly-Si layer having at least one hole. Next, the cap layer is removed, and then a portion of the insulating layer within the hole is removed to form a first opening in the insulating layer, and the first opening and the insulating layer form a second opening. Subsequently, a second a-Si layer is formed over the first a-Si layer and the second opening, wherein the second a-Si layer has a recess over the second opening. Finally, the resulting structure is subjected to a second laser annealing, wherein an unfused portion of the second a-Si layer at a bottom of the second opening serves as a seed for crystal growth during the crystallization, thus the second a-Si layer is transformed into a second poly-Si layer.

The present invention provides another method of fabricating a poly-Si thin film. A substrate is provided. An insulating layer, a first a-Si layer, and a cap layer are sequentially formed over the substrate. A first laser annealing is performed to transform the first a-Si layer into a first poly-Si layer having at least a first hole. Afterwards, the cap layer is removed, removing a portion of the insulating layer exposed within the first hole to form a first opening in the insulating layer, and the first hole and the first opening define a second opening. Then a dielectric layer is formed over the first poly-Si layer and the second opening, and a second a-Si layer is formed over the dielectric layer, wherein the second a-Si layer has a recess over the second opening. Finally, the resulting structure is subjected to a second annealing, wherein a portion of the second a-Si layer within the recess serves as the seed for crystal growth during the crystallization, so that the second a-Si layer is transformed into a second poly-Si layer.

The present invention provides another method of fabricating a poly-Si thin film. A substrate is provided. An insulating layer, a first a-Si layer, and a cap layer are formed sequentially over the substrate. Thereafter the resulting structure is subjected to a first annealing wherein the first a-Si layer is transformed into a first poly-Si layer having at least a first hole. Next, the cap layer is removed, and then a portion of the insulating layer exposed within the first hole is removed to form a first opening in the insulating layer, and the first hole and the first opening form a second opening. Then a dielectric layer having a second hole is formed over the first poly-Si layer and the second opening, wherein the second hole is formed within the second opening. Next, a second a-Si layer is formed over the dielectric layer. Finally, the resulting structure is subjected to a second laser annealing. A portion of the second a-Si layer over the second hole is subjected to a higher temperature than other portion of the second a-Si layer relative to the second hole, and crystallization lasts longer, so that the second a-Si layer is transformed into a second poly-Si layer.

According to the foregoing description, it is noted that a proper deep sub-micron hole in the insulating layer is formed by sequentially forming an insulating layer, a a-Si layer and a cap layer over the substrate and then performing a laser annealing process without performing any photolithography and etching. Accordingly, process steps such as light exposure, photolithography and additional deposition as described above for forming an opening having a deep sub-micron feature can be effectively excluded. Thus, the throughput can also be effectively increased.

Moreover, the method of the present invention can be implemented without precisely controlling the process conditions by forming the cap layer, the a-Si layer, the insulating layer or laser annealing process. Thus the method of the present invention has a broader process tolerance compared to the conventional process described above.

DETAILED DESCRIPTION

First Embodiment

Referring to FIGS. 2A to 2E, show the cross sectional views illustrating the progression of the process of a method of fabricating a polysilicon (poly-Si) thin film according to the first embodiment of the present invention.

Figure 2A:
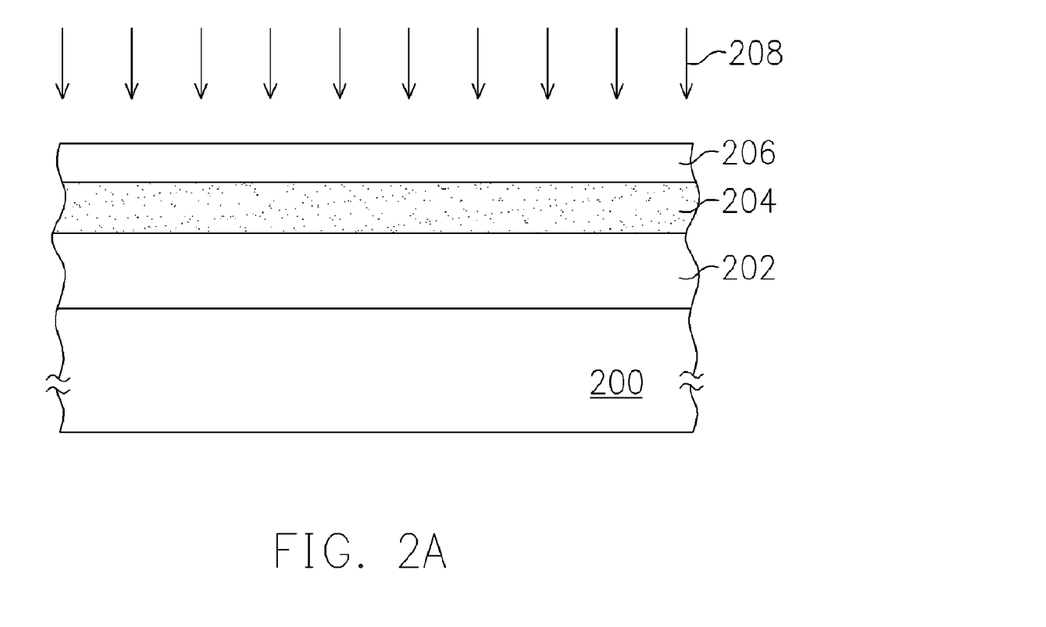
FIGS. 2A to 2E show the cross sectional views illustrating the progression of the process of a method of fabricating a poly-Si thin film according to a first embodiment of the present invention.

Referring to FIG. 2A, a substrate 200 is provided, wherein the material of the substrate 200 includes a silicon wafer, a glass substrate or a plastic substrate, for example. An insulating layer 202 is formed over the substrate 200, wherein the insulating layer 202 includes silicon dioxide can be formed by performing a conventional deposition process such as Low Pressure Chemical Vapor Deposition (LPVCD), Plasma Enhanced Chemical Vapor Deposition (PECVD) or sputtering. Thereafter a first a-Si layer 204, which can be formed by performing a conventional process such as LPVCD, PECVD or sputtering, is formed over the insulating layer 202. Further, a cap layer 206 is formed over the first a-Si layer 204, wherein the material of the cap layer 206 includes a silicon dioxide, for example, wherein the cap layer 206 may be formed by performing a conventional deposition process such as LPCVD, PECVD, or sputtering. Afterwards, the resulting structure is subjected to a first laser annealing 208, for example, an excimer laser may be used to perform the first laser annealing 208, so as to fuse the first a-Si layer 204. The energy density of the excimer laser is about 50 to 500 mJ/cm$^2$.

Figure 2B:
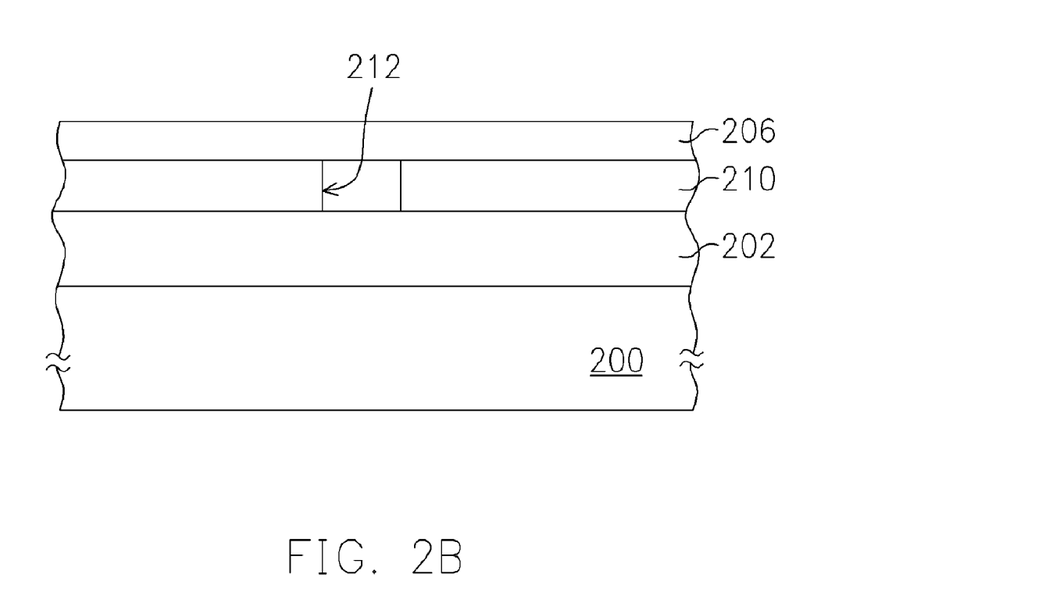

Referring to FIG. 2B, a first poly-Si layer 210 is formed transformed from the first a-Si layer 204 through crystallization. In addition, a plurality of holes are randomly formed in the first poly-Si layer 210, however, in the FIG. 2B, only one hole 212 is shown for illustration purpose.

According to the foregoing procedures, the reasons why the hole 212 is formed in the first poly-Si layer 210 is not exactly known but it is most likely due to a cohesion force of poly-Si being stronger than an adhesion force between the cap layer and the first poly-Si layer 210. The first poly-Si layer 210 shrinks inwardly to form the holes 212 as the first a-Si layer 204 is transformed into the first poly-Si layer 210. Additionally, each of the holes 212 has the feature of a proper deep sub-micron dimension for back-end crystallization.

Figure 2C:
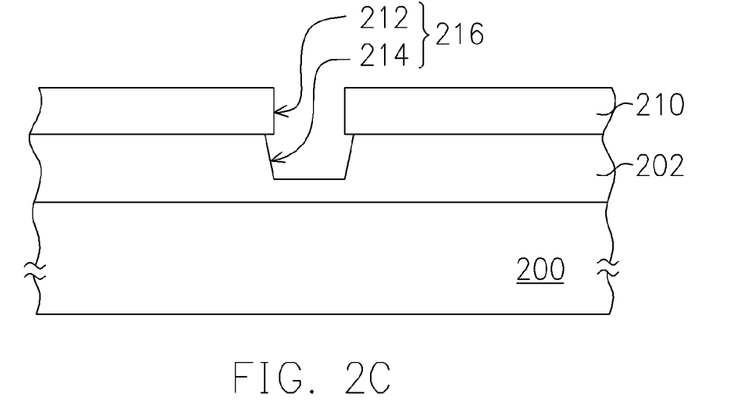

Referring to FIG. 2C, the cap layer 206 is removed by performing a wet etching or an anisotropic dry etching. Thereafter, a portion of the insulating layer 202 exposed within the hole 212 is removed to form a first opening 214, wherein the step of removing the portion of the insulating layer 202 exposed within the first opening 214 can be carried out by performing a wet etching, for example. The width of the first opening 214 is smaller than about 0.5 micronfor further crystallization. The hole212 and the first opening 214 form a second opening 216.

Figure 2D:
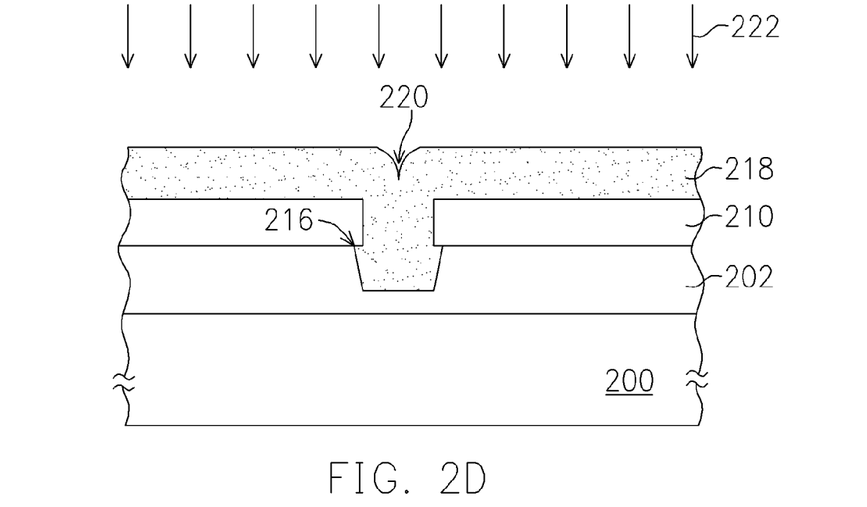

Referring to FIG. 2D, a second a-Si layer 218 is formed over the first poly-Si layer 210 and the second opening 216, wherein the second a-Si layer 218 is deposited by performing LPCVD, PECVD, or sputtering, for example, wherein the second a-Si layer 218 includes a recess 220 neighboring with the second opening 216. The resulting structure is subjected to a second laser annealing 222, for example, using an excimer laser to irradiate the second a-Si layer 218 with an energy density of about 50 to 500 mJ/cm$^2$ so as to fuse the second a-Si layer 218 and the first poly-Si layer 210. According to the second opening 216, an unfused portion of the second a-Si layer 218 serves as a seed for crystallization, wherein the unfused portion of the second a-Si layer 218 is at the bottom of the second opening 216.

Figure 2E:
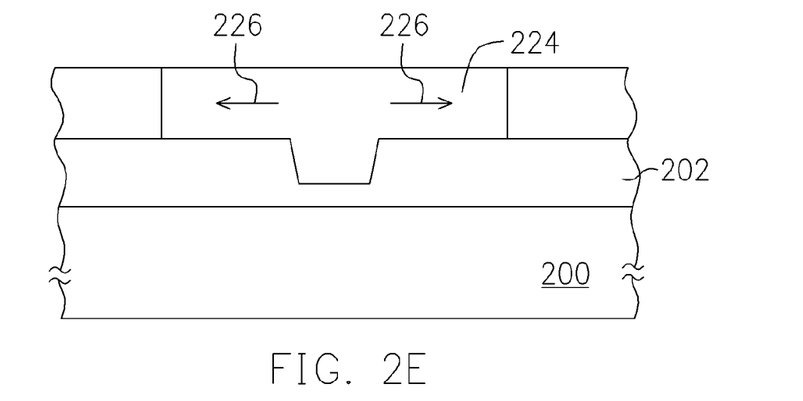

Finally, referring to FIG. 2E, a second poly-Si layer 224 is transformed from a fused portion of the second a-Si layer 218 and the first poly-Si layer 210 crystal growing in a lateral direction 226.

Second Embodiment

Referring to the FIGS. 3A to 3F, show the cross sectional views illustrating the progression of the process of a method of fabricating a poly-Si film according to a second embodiment of the present invention.

Figure 3A:
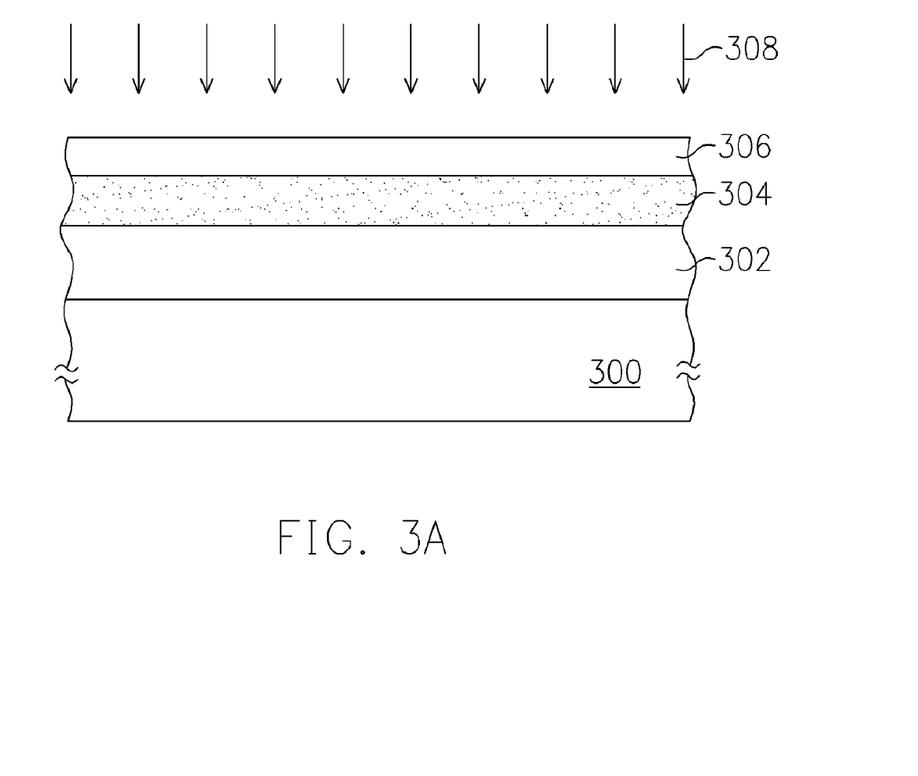
FIGS. 3A to 3F show the cross sectional views illustrating the progression of the process of a method of fabricating a poly-Si thin film according to a second embodiment of the present invention.

Referring to FIG. 3A, a substrate 300 is provided, wherein the material of the substrate 300 includes, for example, a silicon wafer, a glass or a plastic. An insulating layer 302 is formed over the substrate 300, wherein the material of the insulating layer 302 includes, for example, a silicon dioxide, and the insulating layer 302 can be formed by, for example, performing a conventional deposition process such as a LPVCD, a PECVD or a sputtering. Thereafter, a first a-Si layer 304 is formed over the insulating layer 302, by performing, for example, a LPCVD, PECVD or sputtering process.

Further, a cap layer 306 is formed over the first a-Si layer 304, wherein the material of the cap layer 306 includes temptemp, for example, silicon dioxide, and the cap layer 306 can be formed by, for example, performing a conventional deposition process such as LPCVD, PECVD or sputtering. The resulting structure is then subjected to a first laser annealing 308, for example, performing an excimer laser annealing to fuse the first a-Si layer 304. The energy density of the excimer laser is about 50 to 500 mJ/cm$^2$.

Figure 3B:
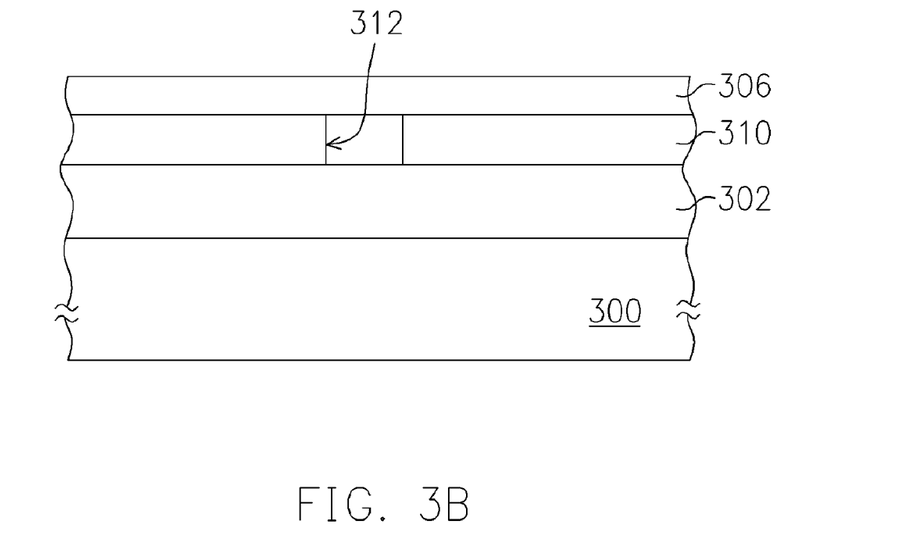

Referring to FIG. 3B, a first poly-Si layer 310 is formed transformed from the first a-Si layer 304 through the fusion and crystallization. Moreover, as described in the first embodiment, as the first a-Si layer 304 is transformed to the first poly-Si layer 310, a plurality of holes 312 are randomly formed in the first poly-Si layer 310, however only a single hole 312 is shown in FIG. 3B for illustration purpose.

Figures 3C, 3D:
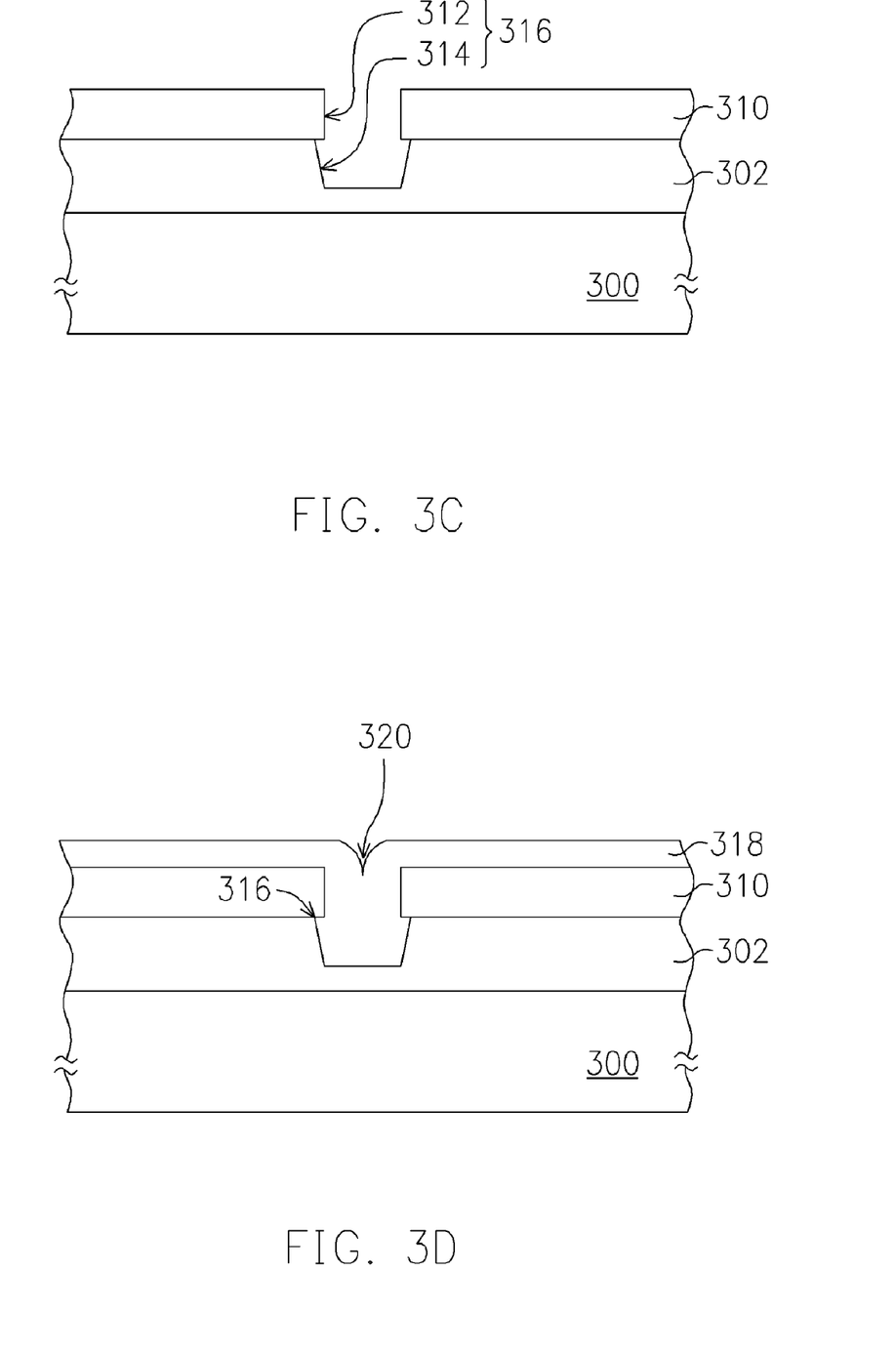

Referring to FIG. 3C, the cap layer 306 is removed, wherein the step of removing the cap layer 306 is accomplished by, for example, performing a wet etching using hydrofluoric acid or an anisotropic dry etching. Thereafter, a portion of the insulating layer 302 exposed within the hole 312 is removed to form a first opening 314, wherein the portion of the insulating layer 302 exposed within the first opening 314 can be removed by, for example, performing a wet etching. The first opening 314 has a width smaller than about 0.5 micron for further crystallization. The hole 312 and the first opening 314 constitute a second opening 316.

Referring to FIG. 3D, a dielectric layer 318 is formed over the first poly-Si layer 310 and the second opening 316, wherein the dielectric layer 318 can be formed by, for example, performing a conventional process such as either LPCVD, PECVD or sputtering, wherein the dielectric layer 318 includes a recess 320 neighboring with the second opening 316.

Figure 3E:
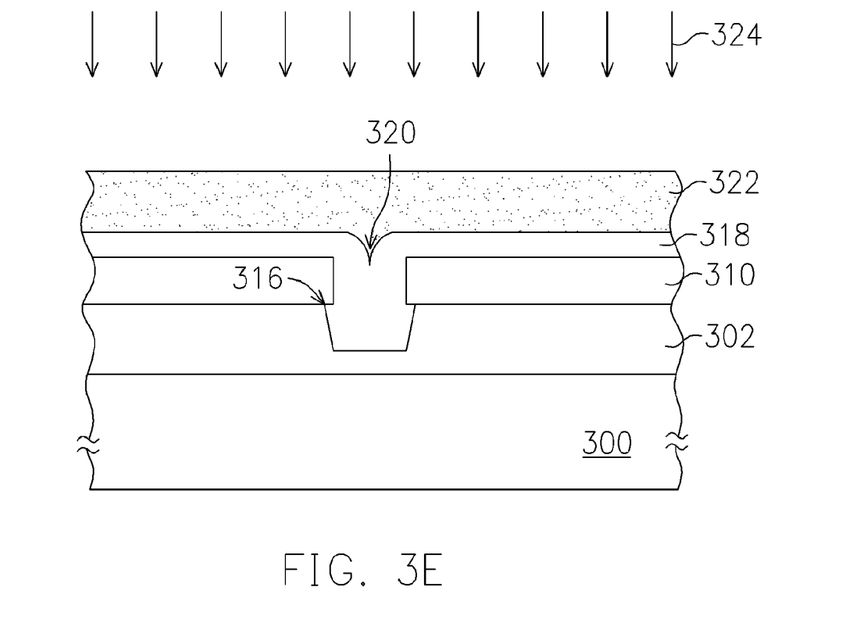

Referring to FIG. 3E. a second a-Si layer 322 is formed over the dielectric layer 318, wherein the second a-Si layer 322 is formed by, for example, performing with a conventional deposition process such as a LPCVD, a PECVD, or a sputtering process. Thereafter, the resulting structure is subjected to a second laser annealing by performing, for example, an excimer laser annealing, to irradiate the second a-Si layer 322. The energy density of the excimer laser is about 50 to 500 mJ/cm$^2$.

Figure 3F:
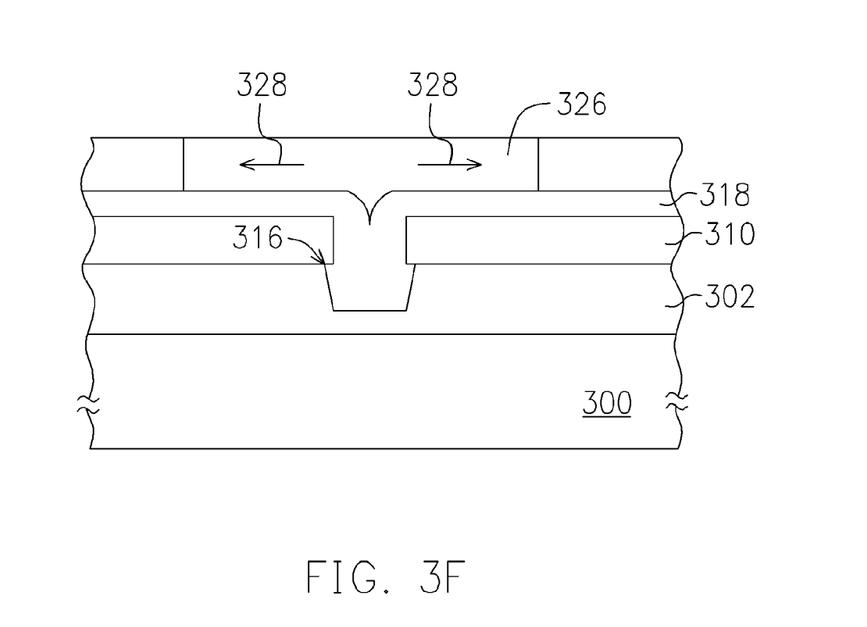

Finally, referring to FIG. 3F, a second poly-Si layer 326 is formed transformed from a fused portion of the second a-Si layer 322 crystal growing in a lateral direction 328, wherein an unfused portion of the second a-Si layer 322 neighboring with the recess 320 serves as a seed for crystallization.

Referring to the FIGS. 4A to 4F, show the cross-sectional views illustrating the progression of the process of the method of fabricating a poly-Si film according to a third embodiment of the present invention.

Figure 4A:
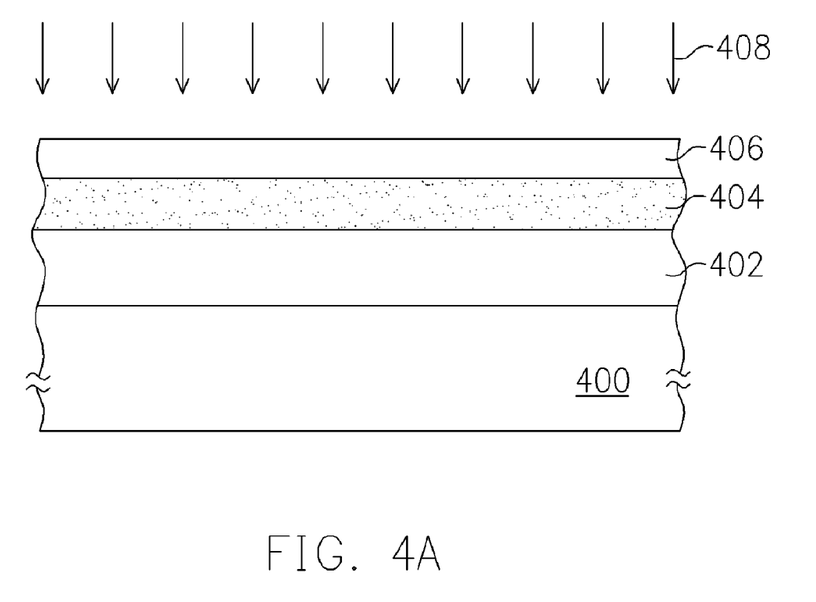
FIGS. 4A to 4F show the cross sectional views illustrating the progression of the process of a method of fabricating a poly-Si thin film according to a third embodiment of the present invention.

Referring to FIG. 4A, a substrate 400 is provided, wherein the material of the substrate 400 includes, for example, silicon wafer, glass, or plastic. An insulating layer 402 is formed over the substrate 400, wherein the material of the insulating layer 402 includes, for example, silicon dioxide, and wherein the insulating layer 402 can be formed by performing conventional deposition methods such as LPVCD, PECVD, or sputtering. Thereafter a first a-Si 404 is formed over the insulating layer 402, which can be formed by performing LPCVD, PECVD or sputtering method, for example.

Next, a cap layer 406 is formed over the first a-Si layer 404, wherein the material of the cap layer 406 includes, for example, silicon dioxide, and wherein the cap layer 406 can be formed by performing conventional deposition methods such as LPCVD, PECVD or sputtering method. Thereafter, the resulting structure is subject to a first laser annealing 408 by performing, for example, an excimer laser, so as to fuse the first a-Si layer 404. The energy density of the excimer laser is about 50 to 500 mJ/cm$^2$.

Figure 4B:
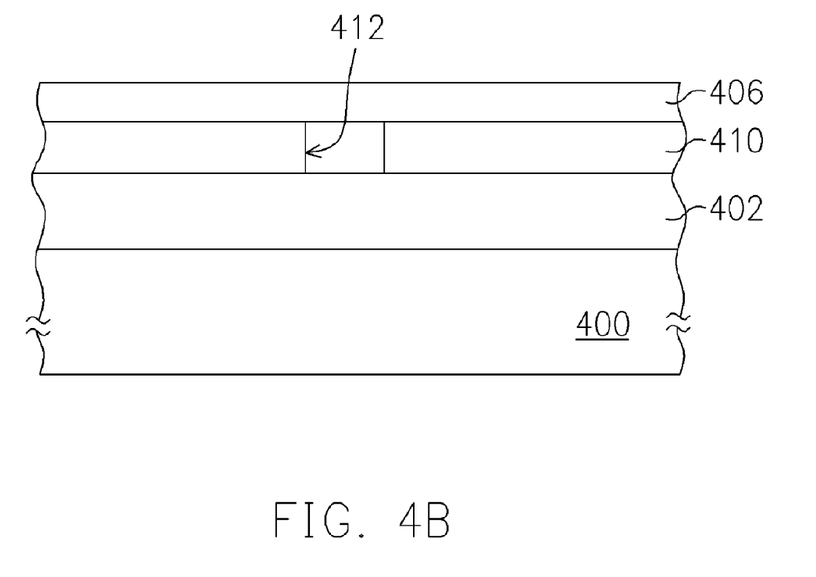

Referring to FIG. 4B, a first poly-Si layer 410 is formed from the first a-Si layer 404 through fusion and crystallization. Moreover, a plurality of first holes 412 are randomly formed in the first poly-Si layer 410, however, in the FIG. 4B, only one first hole 412 is shown for illustration purpose.

Figure 4C:
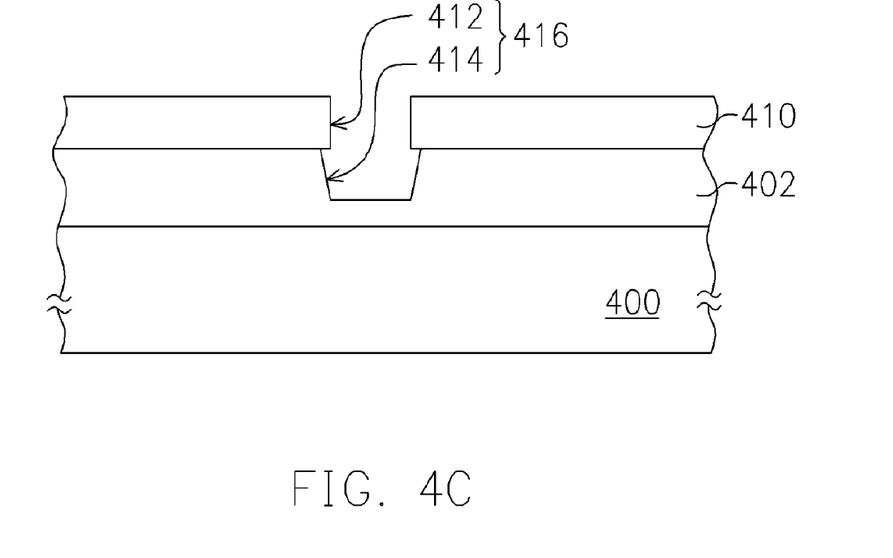

Further, referring to FIG. 4C, the cap layer 406 is removed, wherein the method for removing the cap layer 406 is accomplished by performing a wet etching using hydrofluoric acid or anisotropic dry etching. Thereafter, a portion of the insulating layer 402 within the first hole 412 is removed to form a first opening 414, wherein the portion of the insulating layer 402 is removed by performing a wet etching, for example. The first opening 414 formed by the foregoing method has a width smaller than about 0.5 micron for further crystallization. The first opening 412 and the first opening 414 constitute a second opening 416.

Figure 4D:
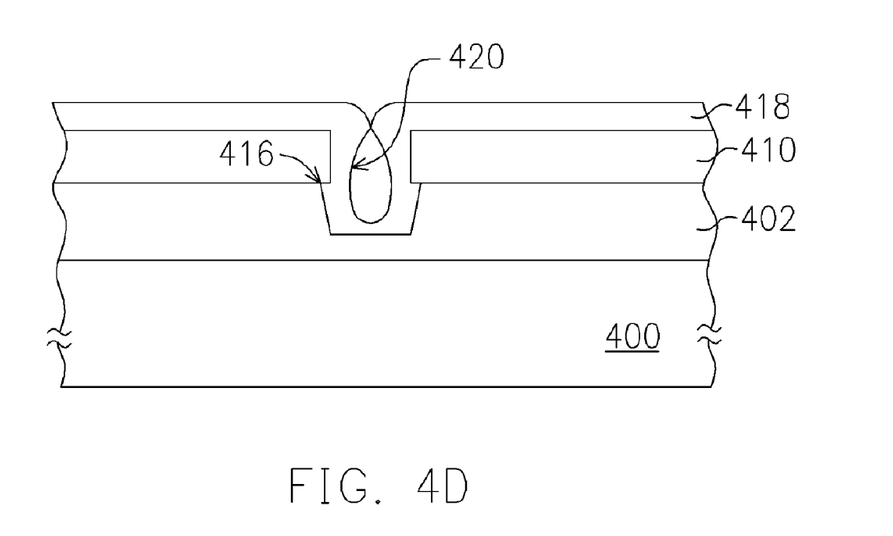

Next, referring to FIG. 4D, a dielectric layer 418 is formed over the first poly-Si layer 410 and the second opening 416, wherein the dielectric Layer 418 can be formed by performing LPCVD, PECVD or sputtering, for example. A second hole 420 is formed as an air space in the dielectric layer 418, wherein the second hole 420 is neighboring with the second opening 416.

Figure 4E:
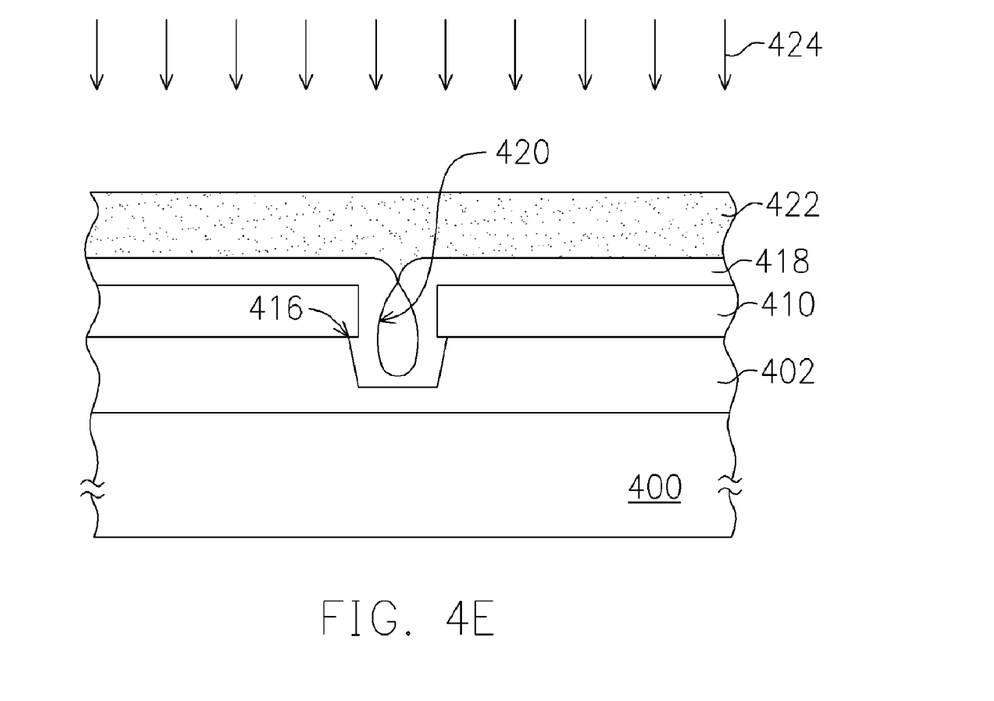

Furthermore, referring to FIG. 4E, a second a-Si layer 422 is formed over the dielectric layer 418, wherein the second a-Si layer 422 is formed by performing LPCVD, PECVD or sputtering, for example. Thereafter, the resulting structure is subjected to a second laser annealing 442 by performing an excimer laser annealing for example, to irradiate and fuse the second a-Si layer 422, The energy density of the excimer laser is about 50 to 500 mJ/cm$^2$.

Figure 4F:
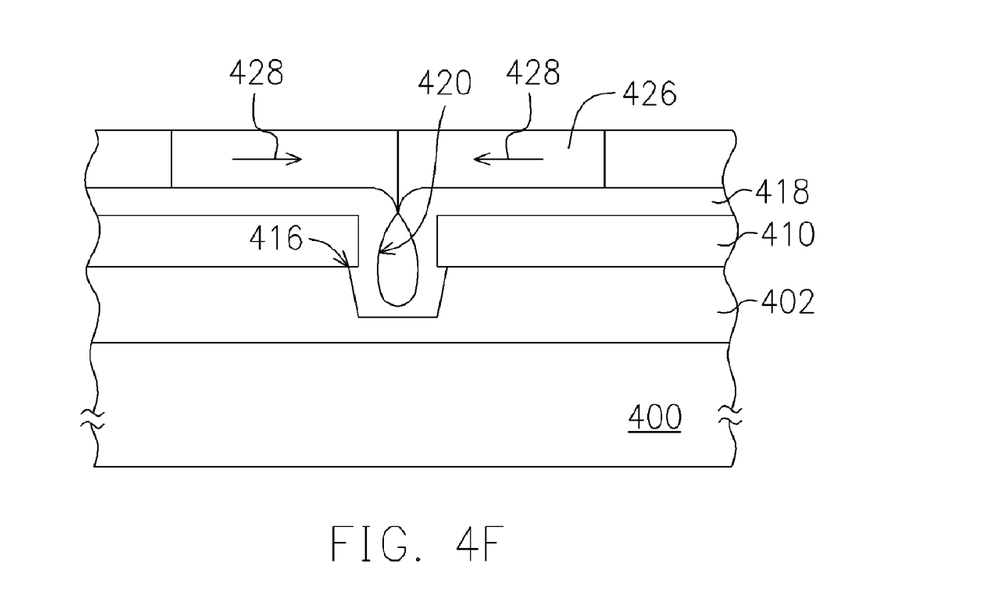

Finally, referring to FIG. 411, a second poly-Si layer 426 is transformed from the second a-Si layer 422 through fusion and crystallization. When the second laser annealing 424 is performed, a portion of the second a-Si layer 422 over the second hole 420 is subjected to a higher temperature than other portion of the second a-Si player 422 relative to the second hole 420 because the thermal conductivity is poor around the second hole 420. A lateral crystallization progress from a region with lowest temperature (not shown) along the direction 428 is performed, wherein the lateral crystallization lasts longer around the second hole 420.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. A method of fabricating a polysilicon film, comprising:

providing a substrate;

forming an insulating layer, a first amorphous silicon layer and a cap layer over the substrate;

performing a first annealing to transform the first amorphous silicon layer into a first polysilicon layer with at least a hole;

removing the cap layer;

removing a portion of the insulating layer within the hole to form a first opening within the insulating layer, wherein the hole and the first opening constitute a second opening;

forming a second amorphous silicon layer over the first polysilicon layer and filling the second opening, wherein a recess is formed over a portion of the second amorphous silicon layer over the second opening; and performing a second annealing and forming a second polysilicon layer by partially fusing the second amorphous silicon layer and the first polysilicon layer, and taking an unfused portion of the second amorphous silicon layer as seeds for crystallization.

2. The method of fabricating a polysilicon film as recited in claim 1, wherein the cap layer comprises silicon dioxide.

3. The method of fabricating a polysilicon film as recited in claim 1, wherein the step of performing the first annealing comprises performing an excimer laser annealing process.

4. The method of fabricating a polysilicon film as recited in claim 1, wherein the step of removing the portion of the insulating layer within the hole comprises performing a wet etching using a solution containing hydrofluoric acid.

5. The method of fabricating a polysilicon film as recited in claim 1, wherein the step of performing the second annealing comprises performing an excimer laser annealing process.

6. The method of fabricating a polysilicon film as recited in claim 1, wherein a width of the second opening is smaller than one micron.

* * * * *